United States Patent
Lee

(10) Patent No.: US 10,779,437 B2
(45) Date of Patent: Sep. 15, 2020

(54) HEAT SINK

(71) Applicant: PEGATRON CORPORATION, Taipei (TW)

(72) Inventor: Hsiang-Chih Lee, Taipei (TW)

(73) Assignee: Pegatron Corporation, Taipei (TW)

( * ) Notice: Subject to any disclaimer, the term of this patent is extended or adjusted under 35 U.S.C. 154(b) by 82 days.

(21) Appl. No.: 16/203,974

(22) Filed: Nov. 29, 2018

(65) Prior Publication Data
US 2019/0274233 A1 Sep. 5, 2019

(30) Foreign Application Priority Data

Mar. 2, 2018 (TW) .............................. 107202823 U

(51) Int. Cl.
*F24H 3/02* (2006.01)
*H05K 7/20* (2006.01)

(52) U.S. Cl.
CPC ..... *H05K 7/20409* (2013.01); *H05K 7/20145* (2013.01); *H05K 7/20172* (2013.01)

(58) Field of Classification Search
CPC ........... H05K 7/20409; H05K 7/20145; H05K 7/20172

USPC ......................................................... 165/120
See application file for complete search history.

(56) References Cited

U.S. PATENT DOCUMENTS

| | | | | |
|---|---|---|---|---|
| 6,019,165 | A * | 2/2000 | Batchelder | F25B 21/02 165/104.33 |
| 6,945,315 | B1 * | 9/2005 | Gektin | F28D 15/00 165/104.31 |
| 2005/0257919 | A1 * | 11/2005 | White | B60R 13/083 165/104.31 |
| 2007/0012423 | A1 * | 1/2007 | Kinoshita | H01L 23/473 165/80.4 |
| 2018/0324978 | A1 * | 11/2018 | Lin | G06F 1/203 |

* cited by examiner

*Primary Examiner* — Davis D Hwu
(74) *Attorney, Agent, or Firm* — Mincy, Geissler, Olds & Lowe, P.C.

(57) ABSTRACT

The present disclosure is a heat sink used for an electronic component. The heat sink includes a shell body, a fan, and a thermally-conductive strip. The thermally-conductive strip abuts against the shell body. The shell body has an internal space and a side wall, and a channel is formed in the side wall of the shell body for a coolant fluid to flow. At two ends of the channel, a coolant fluid inlet and a coolant fluid outlet are respectively formed on an outer wall surface of the side wall. In this way, when flowing through the shell body, the coolant fluid brings heat of the shell body away. Therefore, heat dissipation efficiency can be substantially increased.

10 Claims, 7 Drawing Sheets

HEAT SINK

CROSS-REFERENCE TO RELATED APPLICATIONS

This application is based upon and claims priority under 35 U.S.C. 119 from Taiwan Patent Application No. 107202823 filed on Mar. 2, 2018, which is hereby specifically incorporated herein by this reference thereto.

BACKGROUND OF THE INVENTION

1. Field of the Invention

The present disclosure relates to a fan heat sink used for an electronic component.

2. Description of the Prior Arts

In the prior art, many electronic components, such as a central processing unit (CPU) and a display card, generate high heat when being used. Therefore, the electronic components need to be used in coordination with heat sinks, to reduce a temperature.

In the prior art, a common heat sink performs heat dissipation by using a fan and a thermally-conductive strip. Referring to FIG. 7, specifically, this type of heat sink includes a fan shell 91, a cover body 92, a fan 93, and a thermally-conductive strip 94. The cover body 92 covers the fan shell 91, and the cover body 92 and the fan shell 91 define an air outlet 95. An air inlet 96 is formed through the cover body 92. The fan 93 is disposed in the fan shell 91, and corresponds to the air inlet 96 of the cover body 92. The thermally-conductive strip 94 is a solid strip object. One end of the thermally-conductive strip 94 abuts against an outer wall surface of the cover body 92 or the fan shell 91, and the other end extends to an electronic component that needs cooling and heat dissipation.

During use, the thermally-conductive strip 94 transfers a high temperature to the fan shell 91 or the cover body 92. After rotating, the fan 93 axially extracts air from the air inlet 96 of the cover body 92 into the fan shell 91, and then radially pushes the air out from the air outlet 95. In a process the air flows out through the cover body 92 and the fan shell 91, the air brings the high temperature out.

However, a disadvantage of the heat sink in the prior art is that, the heat dissipation is performed by using only a fan through air flowing, which may cause an insufficient heat dissipation effect. Therefore, the heat sink in the prior art needs to be improved indeed.

SUMMARY OF THE INVENTION

In view of the foregoing disadvantage and defect in the prior art, the present disclosure provides a heat sink, to substantially improve a heat dissipation effect through flowing of a coolant fluid.

To achieve the foregoing purpose, a technical means used in the present disclosure is to design a heat sink. The heat sink includes a shell body, a fan, and a thermally-conductive strip. The shell body has a side wall and an internal space, where the side wall includes an inner wall surface and an outer wall surface that are opposite to each other. The inner wall surface of the side wall is adjacent to the internal space, a channel is formed between the inner wall surface and the outer wall surface for a coolant fluid to flow, and at two ends of the channel, a coolant fluid inlet and a coolant fluid outlet are respectively formed on the outer wall surface of the side wall. The fan is disposed in the internal space. The thermally-conductive strip abuts against the shell body.

An advantage of the present disclosure is that by forming a channel in the side wall of the shell body, the coolant fluid can be filled in the channel, so that the coolant fluid flows in the side wall of the shell body. When flowing through the shell body from the coolant fluid inlet and the coolant fluid outlet, the coolant fluid brings heat of the shell body away. In this way, the present disclosure can not only bring the heat of the shell body away through flowing of air by the fan, but also reduce the temperature by using the coolant fluid in the side wall of the shell body. Therefore, heat dissipation efficiency can be substantially increased.

Further, the shell body includes a fan shell and a cover body. The fan includes a bottom board and the side wall, in which the fan and the side wall are disposed on a side surface of the bottom board, and the side wall extends along a periphery of the bottom board. The cover body is disposed on the side wall and includes an air inlet, and the cover body, the side wall, and the bottom board jointly define the internal space and an air outlet.

Further, the side wall of the fan shell is U-shaped, the air outlet is located between two ends of the U-shaped side wall, and the coolant fluid inlet and the coolant fluid outlet are respectively located at the two ends of the U-shaped side wall.

Further, the channel is externally connected to a side of the side wall facing the cover body, to form an opening, and the cover body covers and seals off the opening.

Further, the shell body includes two joint pipes, and the two joint pipes are disposed on the outer wall surface of the side wall, and respectively surround a periphery of the coolant fluid inlet and a periphery of the coolant fluid outlet.

Further, both the shell body and the thermally-conductive strip are made of a metal material.

Further, the thermally-conductive strip is fastened to the shell body through soldering.

Further, the thermally-conductive strip is an annular hollow pipe for a coolant fluid to circularly flow. Because the thermally-conductive strip is designed to be annular, heat can circularly flow between an electronic component and the model in the present disclosure. Compared with one-way heat transfer in the prior art, a heat dissipation effect of the model in the present disclosure is better.

Further, the thermally-conductive strip extends round on the shell body, and when being viewed along an axial direction of the fan, the thermally-conductive strip surrounds the fan. In this way, a contact area between the thermally-conductive strip and the shell body can be increased, thereby increasing heat transfer efficiency.

DETAILED DESCRIPTION OF THE PREFERRED EMBODIMENTS

With reference to the drawings and preferred embodiments of the present disclosure, the following further describes technical means used in the present disclosure to achieve a predetermined purpose.

Figure 1:
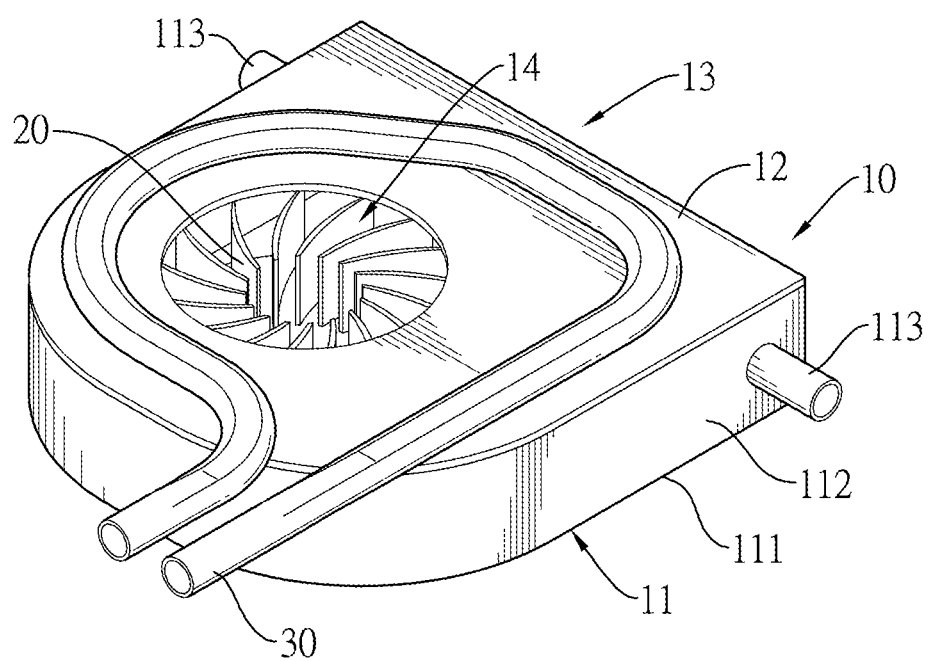
FIG. 1 is a three-dimensional appearance view according to the present disclosure.

Referring to FIG. 1, a heat sink in the present disclosure includes a shell body 10, a fan 20, and a thermally-conductive strip 30.

Figure 2:
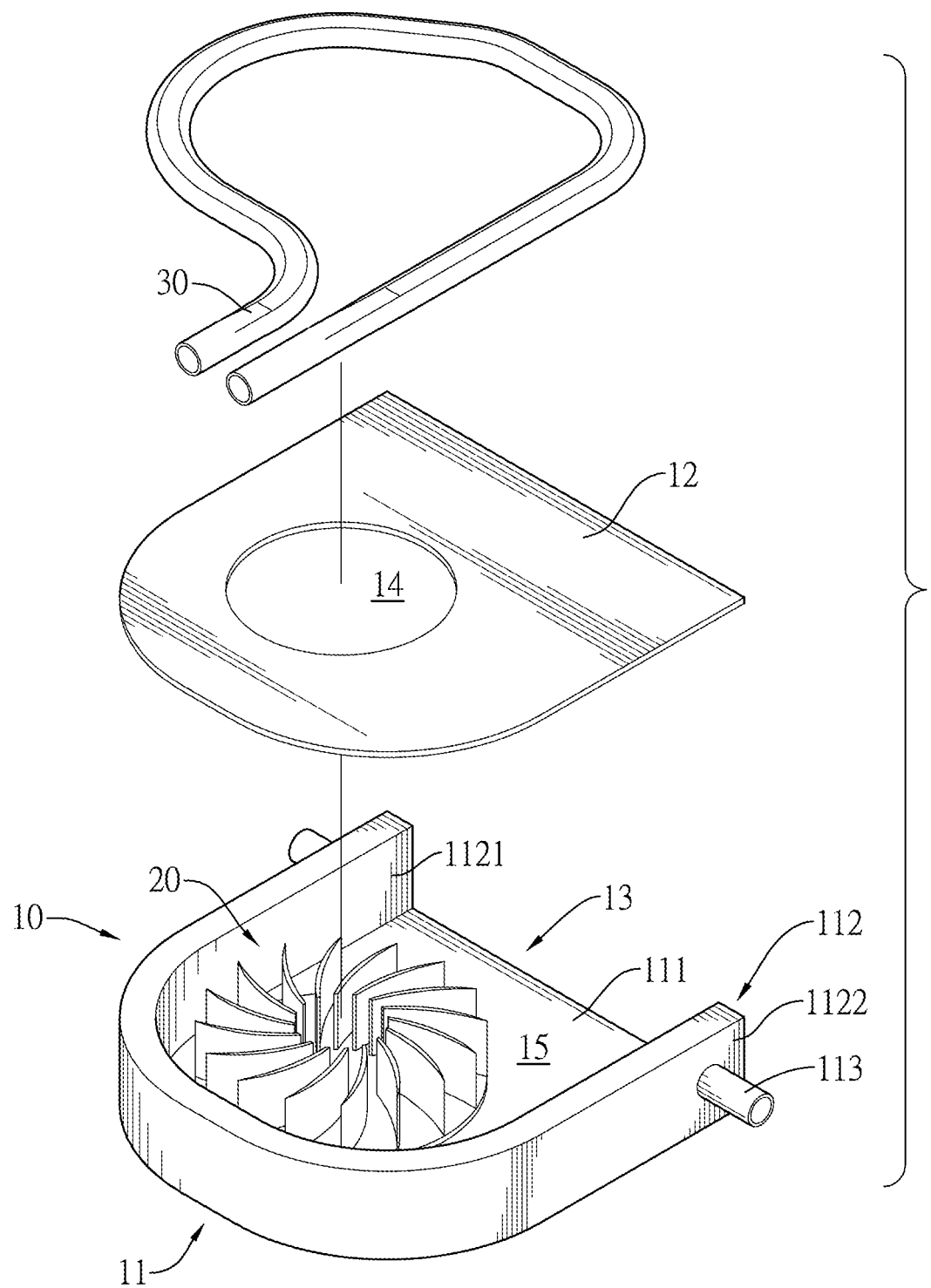
FIG. 2 is an exploded view of components according to the present disclosure.
Figure 3:
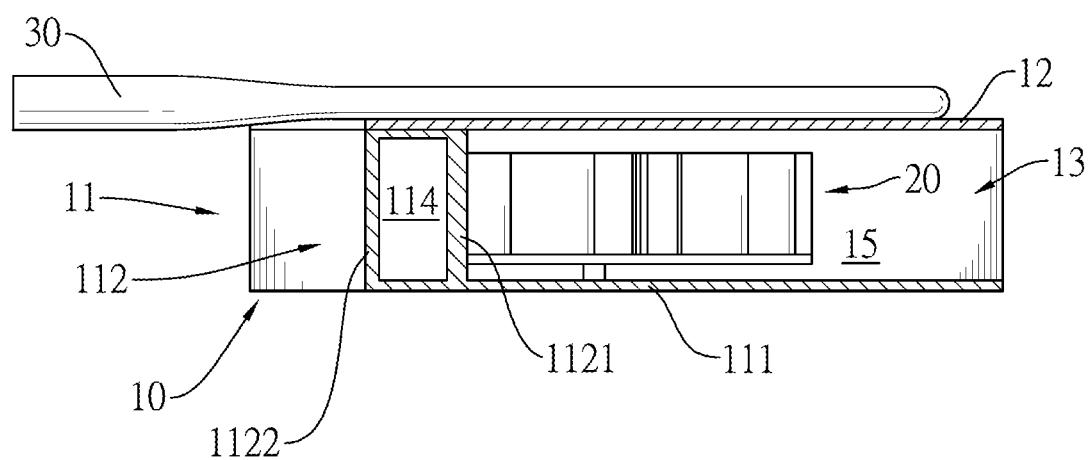
FIG. 3 is a cross-sectional side view according to the present disclosure.
Figure 4:
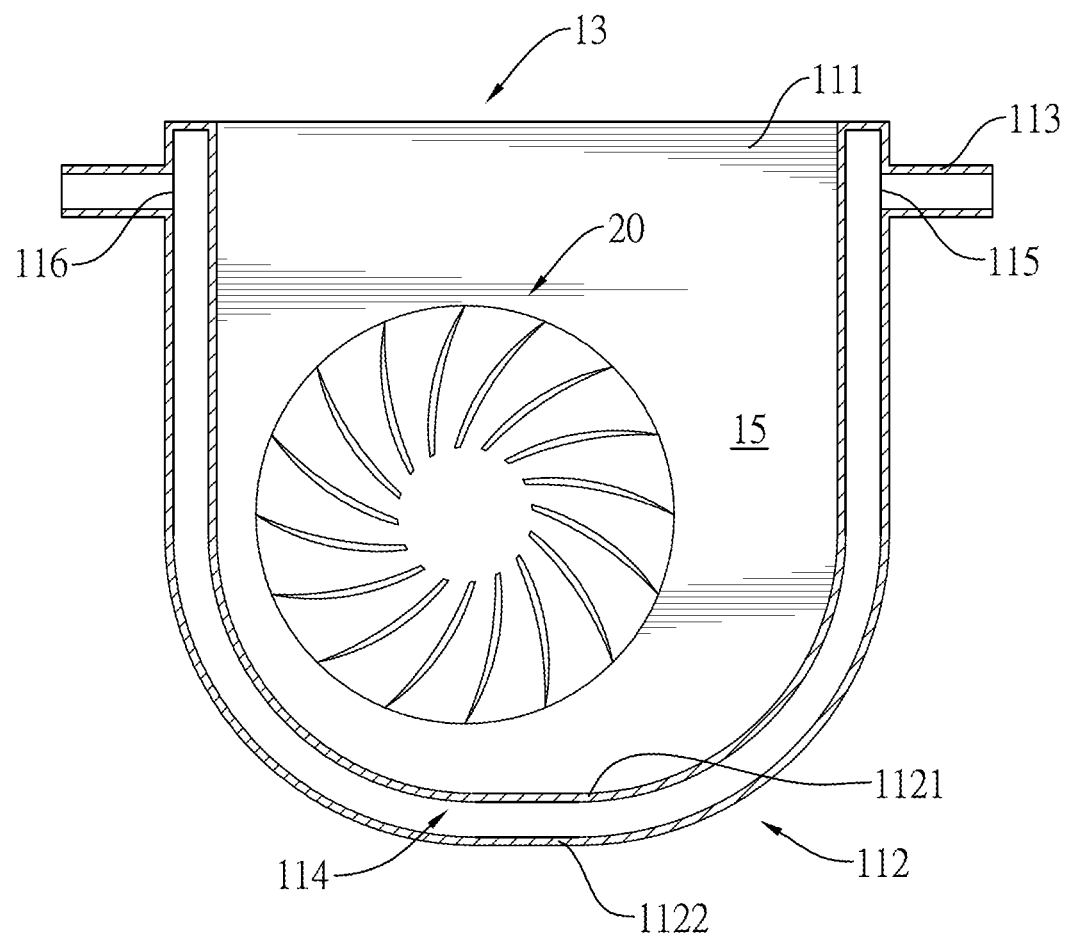
FIG. 4 is a cross-sectional top view of a channel according to the present disclosure.

Also referring to FIG. 2 to FIG. 4, the shell body 10 includes a fan shell 11 and a cover body 12. The fan shell 11 further includes a bottom board 111, a side wall 112, and two joint pipes 113.

The side wall 112 is disposed on a top surface of the bottom board 111, and extends along a periphery of the bottom board 111. The side wall 112 includes an inner wall surface 1121 and an outer wall surface 1122 that are opposite to each other. In this embodiment, the side wall 112 is U-shaped, but is not limited thereto, and may be in another shape.

A channel 114 is formed between the inner wall surface 1121 and the outer wall surface 1122 of the side wall 112. The channel 114 extends to two ends of the U-shaped side wall 112, and at two ends of the channel 114, a coolant fluid inlet 115 and a coolant fluid outlet 116 are respectively formed on the outer wall surface 1122 of the side wall 112 (as shown in FIG. 4). Therefore, a coolant fluid can enter the channel 114 from the coolant fluid inlet 115, flow from one end of the side wall 112 to the other end of the side wall 112 and discharge from the coolant fluid outlet 116, in order to bring heat of the side wall 112 away.

The two joint pipes 113 are both disposed on the outer wall surface 1122 of the side wall 112, and respectively surround a periphery of the coolant fluid inlet 115 and a periphery of the coolant fluid outlet 116. The joint pipes 113 are configured to connect to a pipe, to make it convenient for another pipe to be in communication with the channel 114.

The cover body 12 covers a top side of the side wall 112, and a bottom surface of the cover body 12, the inner wall surface 1121 of the side wall 112 and the top surface of the bottom board 111 jointly define an internal space 15 and an air outlet 13. The air outlet 13 is located between the two ends of the U-shaped side wall 112. In addition, an air inlet 14 is formed through the cover body 12.

In this embodiment, the shell body 10 is made of a transcalent metal material, but is not limited thereto.

The fan 20 is disposed inside the shell body 10, and is specifically disposed on the top surface of the bottom board 111 of the fan shell 11, and is located below the air inlet 14 of the cover body 12.

Figure 5:
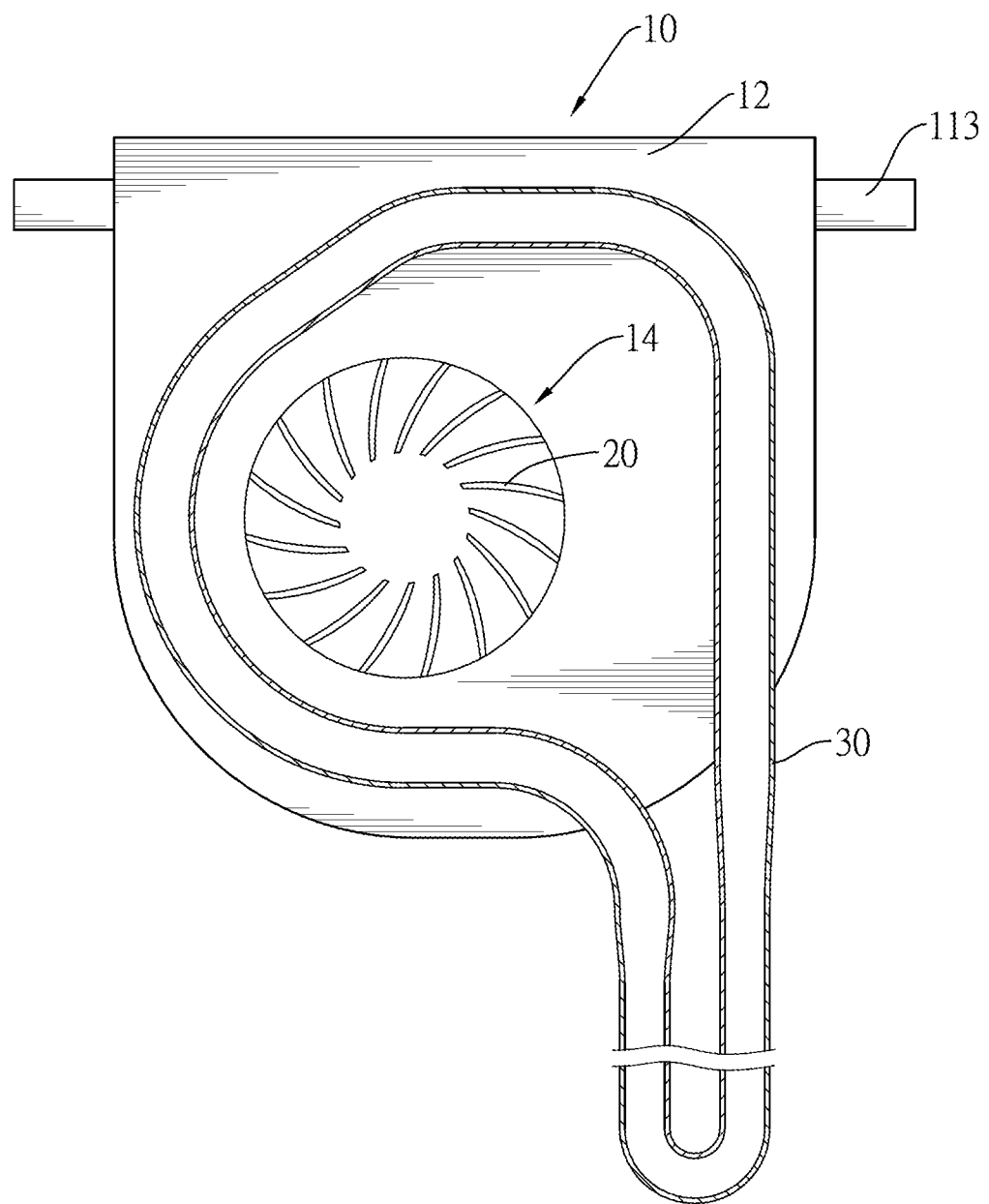
FIG. 5 is a cross-sectional top view of a thermally-conductive strip according to the present disclosure.

Referring to FIG. 2, FIG. 3, and FIG. 5, the thermally-conductive strip 30 abuts against an outer surface of the shell body 10, and in this embodiment, the thermally-conductive strip 30 abuts against a top surface of the cover body 12, but is not limited thereto. The thermally-conductive strip 30 may alternatively abut against a bottom surface of the bottom board 111 or the outer wall surface 1122 of the side wall 112. In addition, in this embodiment, the thermally-conductive strip 30 is made of a transcalent metal material, and is fastened to the shell body 10 through soldering, but neither is limited thereto.

In this embodiment, the thermally-conductive strip 30 is an annular hollow pipe for a coolant fluid to circularly flow therein. Being annular herein does not refer in particular to being circular, but is being an irregular geometric shape provided that the pipe makes a circle and the coolant fluid can circularly flow therein. A part of the thermally-conductive strip 30 extends around the top surface of the cover body 12, and when being viewed from above the cover body 12 (along an axial direction of the fan 20), the thermally-conductive strip 30 surrounds the fan 20 to ensure a sufficient contact area between the thermally-conductive strip 30 and the shell body 10 for enhancing a heat conduction effect.

Referring to FIG. 5, when the present disclosure is used, the other end of the thermally-conductive strip 30 that is opposite to the shell body 10 abuts against an electronic component that needs cooling and heat dissipation. The coolant fluid is filled in the thermally-conductive strip 30, and a pump may be used in coordination to enable the coolant fluid to circularly flow in the annular thermally-conductive strip 30. In this way, the circularly flowing coolant fluid can bring heat of the electronic component to the shell body 10, and the coolant fluid that is cooled after passing through the shell body 10 flows back to the electronic component. As a result, the coolant fluid that is cooled continuously flows to the electronic component, thereby achieving a better heat dissipation effect.

Referring to FIG. 2 and FIG. 3, after the heat of the electronic component is brought to the shell body 10, the fan 20 in the shell body 10 rotates to inhale air into the air inlet 14 of the cover body 12 along the axial direction of the fan 20, and then the air passes through the shell body 10 and is discharged from the air outlet 13 of the shell body 10 along a radial direction of the fan 20. In this air circulation process, heat on the shell body 10 is continuously brought away to achieve a cooling effect.

Referring to FIG. 4, in addition, the two joint pipes 113 of the shell body 10 may alternatively be connected to a pipe, and a pump and a coolant fluid may be further used in coordination, so that the coolant fluid can circularly flow in the pipe and the channel 114 of the side wall 112 of the shell body 10. Alternatively, the two joint pipes 113 of the shell body 10 may be separately connected to a pipe, so that the coolant fluid passes through the shell body 10 in a one-way manner instead of circular flowing. In both the foregoing two manners, heat in the side wall 112 can be quickly brought to another place through flowing of the coolant fluid to perform heat dissipation.

A better heat dissipation effect can be achieved for the heat on the shell body 10 through joint coordination of air flowing of the fan 20 and the coolant fluid flowing in the side wall 112.

From another perspective, the hollow thermally-conductive strip 30 with the coolant fluid flowing inside abuts against the shell body 10 and can be considered as an independent heat exchanger. The channel 114 with coolant fluid flowing inside is disposed in the side wall 112 of the shell body 10, and can also be considered as an independent heat exchanger. The present disclosure achieves higher efficiency for an overall heat dissipation capability through combination of the two heat exchangers. In this way, the present disclosure achieves a purpose of effectively increasing heat dissipation efficiency.

Referring to FIG. 2, in this embodiment, the air inlet 14 of the shell body 10 is located in the axial direction of the fan 20, that is, located on the cover body 12, and the air outlet 13 of the shell body 10 is located in the radial direction of the fan 20, that is, located on a side surface of the shell body 10. However, locations of the air inlet 14 and the air outlet 13 may be interchanged, that is, the air outlet 13 may be disposed on the cover body 12, and the air inlet 14 may be disposed on the side surface of the shell body 10.

In this embodiment, the thermally-conductive strip 30 is a hollow pipe for the coolant fluid to flow therein, but is not limited thereto. The thermally-conductive strip 30 may alternatively be a solid cylinder made of the transcalent metal material, thereby similarly having a function of bringing heat to the shell body 10. However, the present disclosure can still improve a heat dissipation effect through joint coordination of the fan 20 and the coolant fluid in the side wall 112 of the shell body 10.

Figure 6:
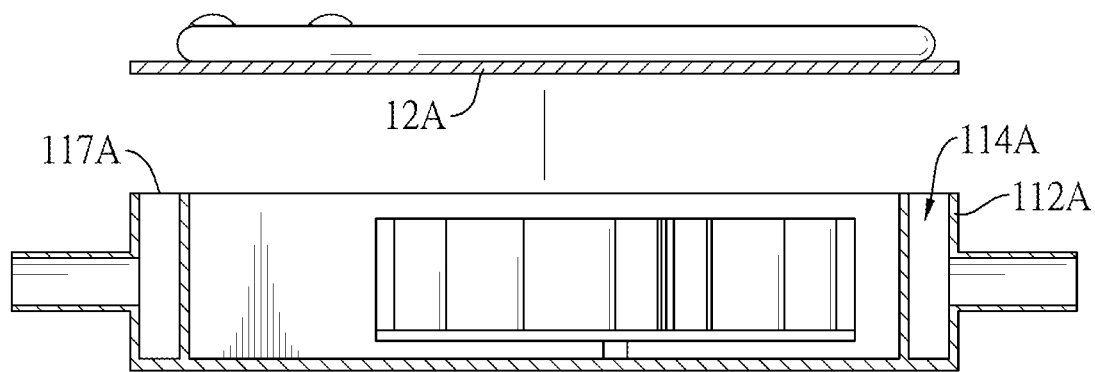
FIG. 6 is an exploded cross-sectional rear view according to another embodiment of the present disclosure.
Figure 7:
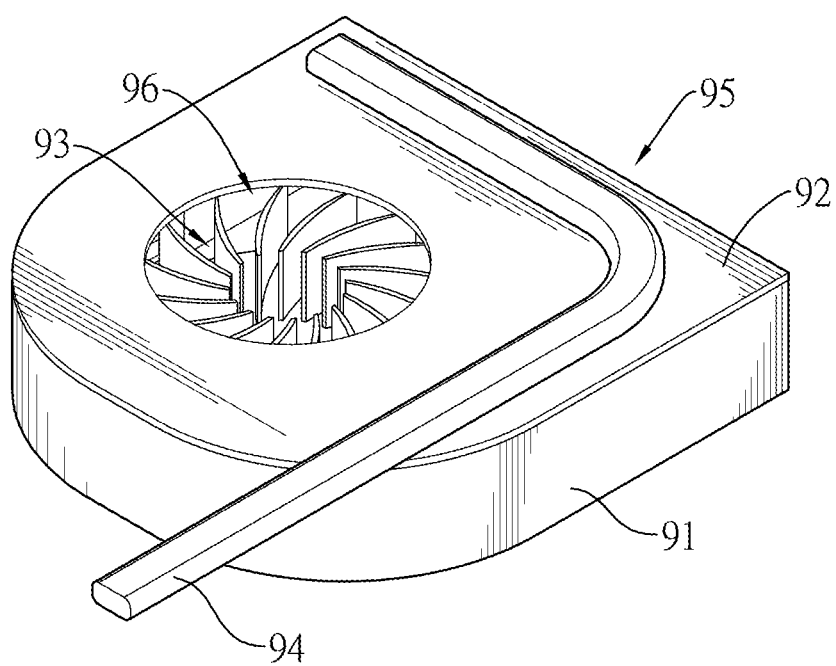
FIG. 7 is a three-dimensional appearance view of a heat sink in the prior art.

In this embodiment, in addition to the outlet and the inlet at the two ends, the channel 114 in the side wall 112 of the shell body 10 is a channel 114 that is buried in the side wall 112. However, the channel 114 is not limited thereto. Referring to FIG. 6, the channel 114A may alternatively be externally connected to a side 112A of the side wall facing the cover body 12A, to form an upper opening 117A, and the cover body 12A covers the opening 117A, so that the channel 114A remains closed (except the outlet and the inlet at the two ends). Such an upper opening design facilitates formation of the channel 114A on the side wall 112A, and makes fabrication convenient.

In addition, in this embodiment, the shell body 10 is formed by combining the fan shell 11 and the cover body 12, but is not limited thereto. The shell body 10 may alternatively be integrally formed or formed through combination by using another manner, provided that the channel 114 is formed in the side wall 112 of the shell body 10, and there are the coolant fluid inlet 115 and the coolant fluid outlet 116 for the coolant fluid to flow.

The foregoing are only preferred embodiments of the present disclosure, but does not limit the present disclosure in any form. The preferred embodiments are already used to disclose the present disclosure above, but are not used to limit the present disclosure. Without going beyond a scope of technical solutions of the present disclosure, any person of ordinary skill in the art may make some variations or modifications to the technical content disclosed above, to obtain equivalent embodiments with equivalent changes. However, any simple alteration, equivalent change, or modification made to the foregoing embodiments based on technical essence of the present disclosure without disobeying content of the technical solutions of the present disclosure still falls within the scope of the technical solutions of the present disclosure.

What is claimed is:

1. A heat sink, comprising:
a shell body, comprising:
an internal space;
a fan shell, comprising a bottom board and a side wall, wherein the side wall is disposed on a side surface of the bottom board, the side wall extends along a periphery of the bottom board, the side wall comprises an inner wall surface and an outer wall surface that are opposite to each other, the inner wall surface of the side wall is adjacent to the internal space, a channel is formed between the inner wall surface and the outer wall surface for a coolant fluid to flow, and at two ends of the channel, a coolant fluid inlet and a coolant fluid outlet are respectively formed on the outer wall surface of the side wall; and
a cover body, disposed on the side wall, wherein the cover body comprises an air inlet, and the cover body, the side wall, and the bottom board jointly forms the internal space and an air outlet;
a fan, disposed on the bottom board and disposed in the internal space; and
a thermally-conductive strip, abutting against the shell body.

2. The heat sink according to claim 1, wherein the side wall of the fan shell is U-shaped, the air outlet is located between two ends of the U-shaped side wall, and the coolant fluid inlet and the coolant fluid outlet are respectively located at the two ends of the U-shaped side wall.

3. The heat sink according to claim 1, wherein the channel is externally connected to a side of the side wall facing the cover body, to form an opening, and the cover body covers and seals off the opening.

4. The heat sink according to claim 1, wherein the shell body further comprises two joint pipes, and the two joint pipes are disposed on the outer wall surface of the side wall, and respectively surround a periphery of the coolant fluid inlet and a periphery of the coolant fluid outlet.

5. The heat sink according to claim 1, wherein both the shell body and the thermally-conductive strip are made of a metal material.

6. The heat sink according to claim 5, wherein the thermally-conductive strip is fastened to the shell body through soldering.

7. The heat sink according to claim 1, wherein the thermally-conductive strip is an annular hollow pipe for the coolant fluid to circularly flow.

8. The heat sink according to claim 7, wherein the thermally-conductive strip extends around the shell body, and when being viewed along an axial direction of the fan, the thermally-conductive strip surrounds the fan.

9. A heat sink, comprising:
a shell body, comprising:
a side wall and an internal space, wherein the side wall comprises an inner wall surface and an outer wall surface that are opposite to each other, the inner wall surface of the side wall is adjacent to the internal space, a channel is formed between the inner wall surface and the outer wall surface for a coolant fluid to flow, and at two ends of the channel, a coolant fluid inlet and a coolant fluid outlet are respectively formed on the outer wall surface of the side wall; and
two joint pipes disposed on the outer wall surface of the side wall, and respectively surrounding a periphery of the coolant fluid inlet and a periphery of the coolant fluid outlet;
a fan, disposed in the internal space; and
a thermally-conductive strip, abutting against the shell body.

10. A heat sink, comprising:
a shell body, comprising:
a side wall and an internal space, wherein the side wall comprises an inner wall surface and an outer wall surface that are opposite to each other, the inner wall surface of the side wall is adjacent to the internal space, a channel is formed between the inner wall surface and the outer wall surface for a coolant fluid to flow, and at two ends of the channel, a coolant fluid inlet and a coolant fluid outlet are respectively formed on the outer wall surface of the side wall;
a fan, disposed in the internal space; and
a thermally-conductive strip, abutting against the shell body;
wherein the thermally-conductive strip is an annular hollow pipe for the coolant fluid to circularly flow; the thermally-conductive strip extends around the shell body, and when being viewed along an axial direction of the fan, the thermally-conductive strip surrounds the fan.

* * * * *